(12) United States Patent
Ahn

(10) Patent No.: US 9,218,306 B2
(45) Date of Patent: Dec. 22, 2015

(54) MEMORY SHARING CIRCUIT EMPLOYING A BUFFERED ADDRESS AND DATA BUS AND PREVENTING BUS COLLISION

(71) Applicant: LSIS CO., LTD., Anyang-si, Gyeonggi-do (KR)

(72) Inventor: Hong seon Ahn, Chungchungbuk-do (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 165 days.

(21) Appl. No.: 13/912,064

(22) Filed: Jun. 6, 2013

(65) Prior Publication Data

US 2013/0332679 A1  Dec. 12, 2013

(30) Foreign Application Priority Data

Jun. 12, 2012 (KR) .......................... 10-2012-0062451

(51) Int. Cl.
  *G06F 13/20*  (2006.01)
  *G06F 13/16*  (2006.01)
  *G11C 7/10*  (2006.01)

(52) U.S. Cl.
  CPC ........ *G06F 13/1663* (2013.01); *G06F 13/1652* (2013.01); *G06F 13/1673* (2013.01); *G11C 7/1051* (2013.01)

(58) Field of Classification Search
  CPC ............ G06F 13/1652; G06F 13/1663; G06F 13/1673; G11C 7/1051
  USPC .................................................. 711/147, 149
  See application file for complete search history.

(56) References Cited

U.S. PATENT DOCUMENTS

| 5,930,502 | A | 7/1999 | Picco et al. | |
|---|---|---|---|---|
| 6,212,607 | B1 * | 4/2001 | Miller et al. | 711/149 |
| 6,513,094 | B1 * | 1/2003 | Magro | 711/103 |
| 2007/0150669 | A1 * | 6/2007 | Ahn et al. | 711/150 |
| 2012/0151159 | A1 * | 6/2012 | Muralimanohar et al. | 711/154 |

FOREIGN PATENT DOCUMENTS

| CN | 1236136 | 11/1999 |
|---|---|---|
| KR | 10-0227740 | 11/1999 |
| KR | 10-0243964 | 2/2000 |
| WO | 2011/094436 | 8/2011 |

OTHER PUBLICATIONS

Korean Intellectual Property Office Application Serial No. 10-2012-0062451, Office Action dated Aug. 26, 2013, 4 pages.

(Continued)

*Primary Examiner* — Than Nguyen
(74) *Attorney, Agent, or Firm* — Lee, Hong, Degerman, Kang & Waimey

(57) ABSTRACT

Disclosed is a memory sharing circuit for sharing a memory, the circuit including a plurality of unit processors connected to the memory, wherein the unit processor includes a buffer configured to be connected through the memory, a buffering address and a data bus, and a processor configured to be connected to the buffer for access to the memory through the buffer, and wherein the plurality of unit processors is configured to allow the processors to share the memory by preventing address/data bus collision for access to the memory by the processors.

19 Claims, 4 Drawing Sheets

(56) References Cited

OTHER PUBLICATIONS

European Patent Office Application Serial No. 13171403.2, Search Report dated Sep. 25, 2013, 7 pages.

The State Intellectual Property Office of the People's Republic of China Application Serial No. 201310233692.X, Office Action dated Oct. 8, 2015, 8 pages.

\* cited by examiner

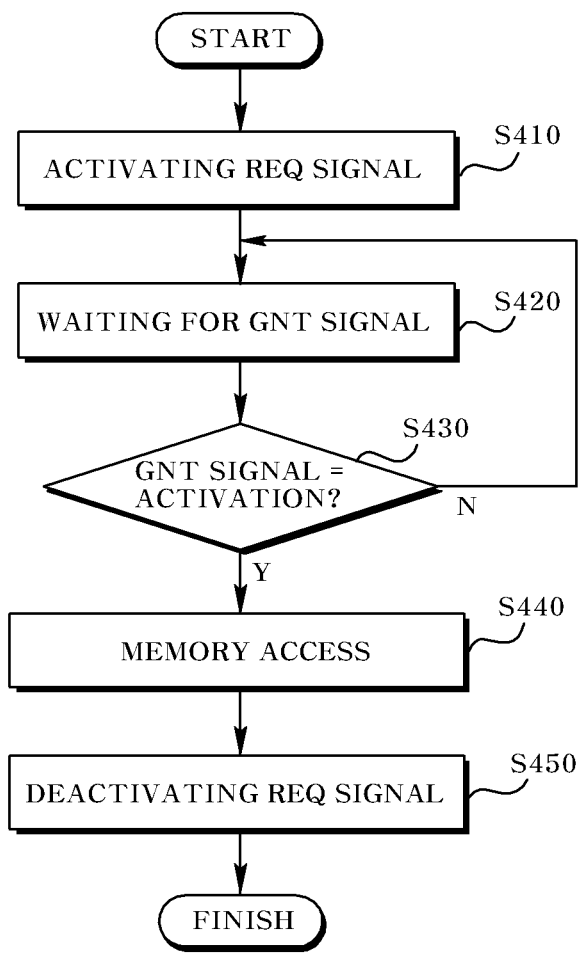

MEMORY SHARING CIRCUIT EMPLOYING A BUFFERED ADDRESS AND DATA BUS AND PREVENTING BUS COLLISION

CROSS-REFERENCE TO RELATED APPLICATION

Pursuant to 35 U.S.C. §119 (a), this application claims the benefit of earlier filing date and right of priority to Korean Patent Application No. 10-2012-0062451, filed on Jun. 12, 2012, the contents of which are hereby incorporated by reference in their entirety.

BACKGROUND OF THE DISCLOSURE

1. Field of Endeavor

The teachings in accordance with exemplary and non-limiting embodiments of this disclosure relate generally to a circuit for memory sharing, and more particularly to a circuit for memory sharing configured to share data among processors of an electronic circuit in an IED (Intelligent Electronic Device) used as a controller for protection/control of an electrical power system.

2. Background

This section provides background information related to the present disclosure which is not necessarily prior art.

An IED (Intelligent Electronic Device) used as a controller for protection/control of an electrical power system is largely embedded with dedicated numeric data processors, or two or more dedicated processors for high speed communication designed to support the IEC61850 standard. Each processor performs operation, control and main processor functions. The IED must be able to perform production and process of massive data such as accident history caused by system accident or control and waveform storage and generation of system at a high speed within 1 msec or at a similar high speed, and the data must be shared among each processor.

To this end, a dual port memory supplied by a conventional memory manufacturer may be used, but usage of dual port memory to an IED system poses several problems.

First, capacity of dual port memory supplied by memory manufacturer is generally limited several hundred Kbytes. An IED used for electric power system requires capacity of massive memory data because it must be shared with several processors for communication, operation and main processing of data of accident waveform information, but most of the commercialized dual port memories cannot be used due to limit in capacity.

Another problem is that the conventionally marketed dual port memory is not a battery backed-up low power memory and therefore is not suitable for an IED that requires data backup through a battery or a super capacitor. Still another problem is that the commercialized dual port memory uses a high-priced IC twice the price of a conventional SRAM.

Hence, there is a need to develop a memory sharing circuit using a general memory.

SUMMARY OF THE DISCLOSURE

This section provides a general summary of the disclosure, and is not a comprehensive disclosure of its full scope or all of its features.

Exemplary aspects of the present disclosure are to substantially solve at least the above problems and/or disadvantages and to provide at least the advantages as mentioned below. Thus, the present disclosure is directed to provide a circuit for memory sharing (hereafter referred to as memory sharing circuit) configured to share data of several Mbytes at a reasonable cost by allowing sharing data among processors of an electronic circuit in an IED (Intelligent Electronic Device) used as a controller for protection/control of an electrical power system.

Technical problems to be solved by the present disclosure are not restricted to the above-mentioned descriptions, and any other technical problems not mentioned so far will be clearly appreciated from the following description by skilled in the art.

In one general aspect of the present disclosure, there is provided a memory sharing circuit for sharing a memory, the circuit comprising a plurality of unit processors connected to the memory, wherein the unit processor includes a buffer configured to be connected through the memory, a buffering address and a data bus, and a processor configured to be connected to the buffer for access to the memory through the buffer, and wherein the plurality of unit processors is configured to allow the processors to share the memory by preventing address/data bus collision for access to the memory by the processors.

Preferably, but not necessarily, the processor may be configured to output an access request (REQ) to the memory to the buffer.

Preferably, but not necessarily, the buffer may be configured to receive the access request (REQ) by the processor, and to buffer and output the access request (REQ).

Preferably, but not necessarily, the circuit may further comprise a logic circuit unit configured to allow a signal buffered and outputted by the buffer to determine a logic value of a grant signal (GNT) of the processor and a logic value of an enable signal (EN) of the buffer.

Preferably, but not necessarily, the grant signal (GNT) may be a signal for allowing an access to the memory of the processor, and the enable signal (EN) may be a signal for activating an output of the buffer.

Preferably, but not necessarily, the logic circuit unit may be configured to allow only a processor of one unit processor among the plurality of unit processors to be accessed to the memory by determining a logic value of the grant signal (GNT) of the memory and a logic value of the enable signal (EN) of the buffer.

Preferably, but not necessarily, the logic circuit unit may be configured such that an REQ1 signal buffered by a first buffer inside a first unit processor of the plurality of unit processors is connected to a first input terminal of an OR gate, an REQ2 signal buffered by a second buffer inside a second unit processor of the plurality of unit processors is connected to a second input terminal of the OR gate through a second inverter (INV_2), and to an enable terminal (EN_1) of the first buffer through a first inverter (INV_1) and to a grant signal terminal (GNT_2) of a second processor inside the second unit processor, and an output of the OR gate is connected to an enable signal terminal of the second buffer through a grant signal terminal (GNT_1) of the first processor inside the first unit processor and to an enable signal terminal of the second buffer through a third inverter (INV_3).

Preferably, but not necessarily, a high signal may be inputted to the GNT_1 terminal, in a case the REQ1 signal is high, and the REQ2 signal is low, and in a case the REQ1 signal is low and the REQ2 signal is low, and a low signal may be inputted to the GNT_2 terminal, to make a memory access request to be allowed only to the second processor inside the second unit processor.

Preferably, but not necessarily, a low signal may be inputted to the GNT_1 terminal and a high signal may be inputted to the GNT_2 terminal, in a case the REQ1 signal is low, and the REQ2 signal is high, to make a memory access request to be allowed only to the first processor inside the first unit processor.

Preferably, but not necessarily, a high signal may be inputted to the GNT_1 terminal and the GNT_2 terminal, in a case all the REQ1 signal and the REQ2 signal are high, to prevent a memory access request from being allowed to both the first and second processors inside the first and second unit processors.

Preferably, but not necessarily, the logic circuit unit may be configured such that, the REQ1 signal buffered by a first buffer inside the first unit processor among the plurality of unit processors is connected to a first input terminal of a first OR gate through the first input terminal of a second OR gate and a first inverter, the REQ2 signal buffered by a second buffer inside a second unit processor among the plurality of unit processors is connected to a second input terminal of a second OR gate through a third inverter and a second input terminal of the first OR gate, an output of the first OR gate is connected to a grant signal terminal (GNT_2) of a second processor inside the second unit processor among the plurality of unit processors, and an output of the second OR gate is connected to an enable terminal of the second buffer through the grant signal terminal (GNT_1) of the first processor inside the first unit processor.

Preferably, but not necessarily, a high signal may be inputted to the grant signal terminal (GNT_1), in a case the REQ1 signal is high, and the REQ2 signal is low, and in a case the REQ1 signal is high and the REQ2 signal is high, and a low signal may be inputted to the GNT_2 terminal to make a memory access request allowed only to the second processor inside the second unit processor.

Preferably, but not necessarily, a low signal may be inputted to the GNT_1 terminal, and a high signal may be inputted to the GNT_2 terminal, in a case the REQ1 signal is low and the REQ2 signal is high, to make a memory access request allowed only to the first processor inside the first unit processor.

Preferably, but not necessarily, a high signal may be inputted to the GNT_1 terminal and the GNT_2 terminal, in a case the REQ1 signal and the REQ2 signal are all low, to prevent a memory access request from being allowed to both the first and second processors inside the first and second unit processors.

Preferably, but not necessarily, a logic circuit unit may be configured such that, the REQ1 signal buffered by the first buffer inside the first unit processor in the plurality of unit processors is connected to a first input terminal of an AND gate, an output of the AND gate is connected to a grant signal terminal (GNT_1) of the first processor inside the first unit processor and to an enable signal terminal of the second buffer, and the REQ2 signal buffered by the second buffer inside the second unit processor in the plurality of unit processors is connected to a second input terminal of the AND gate through an inverter, to an enable terminal of the first buffer and to the grant signal input terminal (GNT_1) of the second processor in the second unit processor.

Preferably, but not necessarily, a high signal may be inputted to the GNT_1 terminal, in a case the REQ1 signal is high and the REQ2 signal is low, and a low signal may be inputted to the GNT_1 terminal to make a memory access request allowed only to the first processor inside the first unit processor.

Preferably, but not necessarily, a low signal may be inputted to the GNT_1 terminal, in a case the REQ1 signal is low and the REQ2 signal is high, and a high signal may be inputted to the GNT_2 terminal to make a memory access request allowed only to the second processor inside the second unit processor.

Preferably, but not necessarily, a low signal may be inputted to the GNT_1 terminal, in a case the REQ1 signal is high and the REQ2 signal is high, and a high signal may be inputted to the GNT_2 terminal to make a memory access request allowed only to one processor provided with priority among the first processor inside the first unit processor and the second processor of the second unit processor.

Preferably, but not necessarily, a low signal may be inputted to both the GNT_1 terminal and the GNT_2 terminal, in a case both the REQ1 signal and the REQ2 signal are low, to make a memory access request allowed to both the first processor and the second processor inside the first and second unit processors.

Preferably, but not necessarily, a pull-up resistor or a pull-down resistor may be connected to an REQ output terminal of the buffer receiving the access request by the processor, buffering the access request and outputting the buffered access request.

In advantageous effect, the memory sharing circuit according to the exemplary embodiments of the present disclosure is configured to share data at a high speed among processors of an electronic circuit unit of an IED (Intelligent Electronic Device) used as a protection/control controller of an electric power system, whereby limitation to use of massive memory such as waveform in an IED of an electric power system due to restricted capacity of a conventional dual port memory can be solved.

BRIEF DESCRIPTION OF THE DRAWINGS

FIG. 4 is a flowchart illustrating an operation procedure of a memory sharing circuit according to an exemplary embodiment of the present disclosure.

DETAILED DESCRIPTION

In describing the present disclosure, the size and relative sizes of layers, regions and/or other elements may be exaggerated or reduced for clarity. Furthermore, the meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification.

Hereinafter, exemplary embodiments of the present disclosure will be described in detail with reference to the accompanying drawings.

Figure 1:
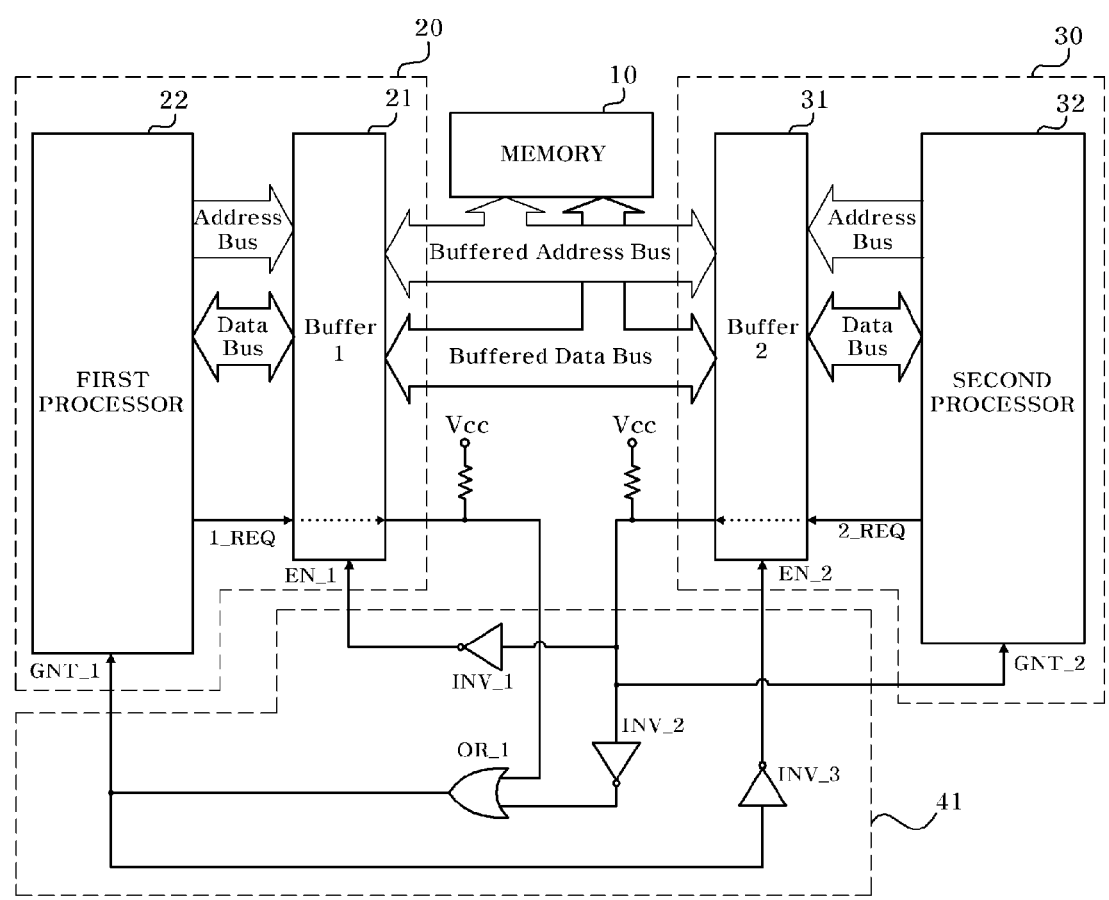
FIG. 1 is a schematic circuit diagram illustrating a connected configuration of a memory sharing circuit according to an exemplary embodiment of the present disclosure.

FIG. 1 is a schematic circuit diagram illustrating a connected configuration of a memory sharing circuit according to an exemplary embodiment of the present disclosure.

Referring to FIG. 1, the memory sharing circuit according to the present disclosure may include a memory (10) for shared use and unit processors (20, 30). Although FIG. 1 illustrates two unit processors (20, 30), the present disclosure is not limited thereto. For example, the unit processors may include an N number of processors, where N=2, 3, 4, . . . .

The unit processors (20, 30) may include buffers (21, 31) configured to be connected to the memory (10) via a buffering address and a data bus, and processors (22, 32) configured to be accessed to the memory (10) via the buffers (21, 31) by being connected to the buffers (21, 31).

Each processor (22, 32) and each buffer (21, 31) are configured to be paired, where these are connected to address bus and data bus, and where a particular bus among these buses may be used to receive and transmit an access request (REQ) signal relative to the memory (10), as illustrated in FIG. 1.

Each buffer (21, 31) may be connected to the memory (10) and buffered address and data bus. Furthermore, a particular bus of each buffer (21, 31) may be used for buffering an input signal for generating the REQ signal and outputting the input signal to a logic circuit unit (41).

The signal (hereinafter referred to as "buffered REQ signal") outputted from the buffer (21, 31) to the logic circuit unit (41) may be used for determining an enable signal (EN) of each buffer through the logic circuit unit (41) and a logic value of a grant signal (GNT) of each processor (22, 32).

Determination of access grant or non-grant to the memory (10) illustrated in FIG. 1 may be configured according to the following Tables 1 and 2.

TABLE 1

[Determination whether to access to memory of processor 1 (22)]

|  | processor 2 | |
| --- | --- | --- |
| Processor 1 | Access request | No access request |
| Access request | Access non-grant | Access grant |
| No access request | Access non-grant | Access non-grant |

TABLE 2

[Determination whether to access to memory of processor 2 (32)]

|  | processor 2 | |
| --- | --- | --- |
| Processor 1 | Access request | No access request |
| Access request | Access grant | Access non-grant |
| No access request | Access grant | Access non-grant |

Referring to Tables 1 and 2, although access grant is basically determined, in a case each processor (22, 32) applies for an access request to the memory (10), access request only to the processor 2 is granted to prevent bus collision for memory (10) access, in a case two processors (22, 32) simultaneously request for memory access. That is, priority is allocated to the processor 2 (32). Configuration of logic circuit unit (41) of FIG. 1 may be determined according to Tables 1 and 2. Meanwhile, the Tables 1 and 2 are just exemplary embodiments, it should be apparent that the logic relationship may be changed according to detailed examples in the exemplary embodiments of the present disclosure.

Now, a connected relationship between the processors (20, 30) of FIG. 1 and the logic circuit unit (41) will be described in more detail.

The memory sharing circuit of FIG. 1 is basically designed to operate at an active low. Furthermore, each buffer (21, 31) is also active low.

The REQ signal buffered by the first buffer (21) may be connected to a first input of the first OR gate (OR_1). Furthermore, the REQ signal buffered by the second buffer (31) may be connected to a second input of the first OR gate (OR_1) via a second inverter (INV_2), and connected to an EN terminal (EN_1) of the first buffer via a first inverter (INV_1), and may be connected to a GNT terminal (GNT_2) of the second processor (32) additionally.

An output of the first OR gate may be connected to a GNT terminal (GNT_1) of the first processor (22), and may be connected to an EN terminal (EN_2) of the second buffer (31) via a third inverter (INV_3).

Furthermore, an output terminal of buffered REQ signal of each buffer (21, 31) may be connected to a pull-up resistor, where, in a case a high signal is inputted to the EN terminals (EN_1, EN_2) of each buffer, and because a signal outputted from the buffers (21, 31) may be floated, and in order to prevent a logic state change of the logic circuit unit (41), the pull-up resistor allows a signal outputted from the buffers (21, 31) to the logic circuit unit (41) to maintain a high level in default.

Now, operation of a memory sharing circuit will be described with reference to FIG. 1. As mentioned before, the memory sharing circuit is set at active low, and an EN terminal of each buffer (21, 31) must be inputted with low in order to buffer and output an input signal. That is, the EN terminal of each buffer (21, 31) is a terminal for receiving a signal for enabling an output of the buffer (21, 31).

For simplicity of explanation, an REQ signal for access to a memory outputted from the first processor (22) is called "1_REQ," an REQ signal for access to a memory outputted from the second processor (32) is called "2_REQ", a signal outputted from the first buffer (21) to the logic circuit unit (41) is called "1_BREQ", and a signal outputted from the second buffer (31) to the logic circuit unit (41) is called "2_BREQ". Meanwhile, it is assumed that in the operation of the memory sharing circuit of FIG. 1, a current EN terminal is in a state of low being inputted, and 1_REQ signal and 2_REQ signal may be all buffered and outputted via the buffers (21, 31).

1) 1_REQ: High, 2_REQ: Low

Because the EN terminal of each buffer (21, 31) is inputted with low, the 1_BREQ signal and the 2_BREQ signal become respectively high and low. Because the 1_BREQ signal is inputted to the first OR gate (OR_1), the first GNT terminal (GNT_1) of the first processor (22) may be inputted with a high. Furthermore, the signal may be reversed via a third inverter (INV_3) to allow the second EN terminal (EN_2) to be inputted with a low.

Furthermore, a 2_BREQ signal may be inputted to the first EN terminal (EN_1) via the first inverter (INV_1), that is, high may be inputted to the first EN terminal, and a 2_BREQ signal may be inputted to a GNT terminal (GNT_2) of the second processor (32) (That is, GNT_2 is inputted with low).

If a logic state of a signal inputted to each above terminal may be expressed in the following Table 3.

TABLE 3

| 1_REQ | H | 2_REQ | L |
| --- | --- | --- | --- |
| GNT_1 | H | GNT_2 | L |
| EN_1 | H | EN_2 | L |

To summarize, because the memory sharing circuit is active low, and in a case 1_REQ is high, and 2_REQ is low, and because a signal inputted to the GNT terminal of each processor (22, 32) and the EN terminal of each buffer (21, 31)

can be determined as provided in Table 3, an access to the memory (10) of the second processor (32) is allowed.

In other words, because only the second processor (32) requests an access request (1_REQ=H, 2_REQ=L) to the memory (10), access to the memory (10) is granted or allowed (GNT_2=L, EN_2=L) only to the second processor (32).

2) 1_REQ: Low, 2_REQ: Low

Because the EN terminal of each buffer (21, 31) is in a state of being inputted with low, the 1_BREQ signal and the 2_BREQ signal become all low. Because the 2_BREQ signal is inputted to the first OR gate (OR_1) via the second inverter (INV_2), the first GNT terminal (GNT_1) of the first processor (22) may be inputted with high. Furthermore, the signal may be reversed via the third inverter (INV_3) to allow the second EN terminal (EN_2) to be inputted with low.

Furthermore, the 2_BREQ signal may be inputted to the first EN terminal (EN_1) via the first inverter (INV_1), that is, the first EN terminal (EN_1) may be inputted with high, and the 2_BREQ signal may be inputted to the GNT terminal (GNT_2) of the second processor (32). (i.e., the GNT_2 is inputted with low).

The logic state of a signal inputted to each above terminal may be expressed in the Table 4.

TABLE 4

| 1_REQ | L | 2_REQ | L |
|---|---|---|---|
| GNT_1 | H | GNT_2 | L |
| EN_1 | H | EN_2 | L |

To summarize, because the memory sharing circuit is active low, and in a case all the 1_REQ signal and 2_REQ signal are low, and because a signal inputted to GNT terminal of each processor (22, 32) and the EN terminal of each buffer (21, 31) can be determined as provided in Table 4, access to the memory (10) of the second processor (32) is allowed. In other words, even if access request to the memory (10) of each processor (22, 32) in inputted (1_REQ signal and 2_REQ signal are all low), memory (10) access to the second processor (32) is only allowed.

3) 1_REQ: Low, 2_REQ: High

Because the EN terminal of each buffer (21, 31) is in a state of low being inputted, the 1_BREQ signal becomes low and the 2_BREQ signal becomes high.

Furthermore, the 2_BREQ signal may be inputted to the first EN terminal (EN_1) via the first inverter (INV_1), that is, the first EN terminal (EN_1) is inputted with low, and the 2_BREQ signal may be inputted to the GNT terminal (GNT_2) of the second processor (32) (i.e., the GNT_2 is inputted with high).

Because the 1_BREQ signal is directly inputted to the first terminal of the first OR gate (OR_1), and the 2_BREQ signal is inputted to the second terminal of the first OR gate (OR_1) via the second inverter (INV_2), the first GNT terminal (GNT_1) of the first processor (22) may be inputted with low. Furthermore, the signal may be reversed via the third inverter (INV_3) to allow the second EN terminal (EN_2) to be inputted with high.

The logic state of the signal inputted into each terminal may be expressed as per the following Table 5.

TABLE 5

| 1_REQ | L | 2_REQ | H |
|---|---|---|---|
| GNT_1 | L | GNT_2 | H |
| EN_1 | L | EN_2 | H |

To summarize, because the memory sharing circuit is active low, and in a case the 1_REQ signal is low and the 2_REQ signal is high, and because the signal inputted into GNT terminal of each processor (22, 32) and EN terminal of each buffer (21, 31) is determined as in the above Table 5, access request to the memory (10) of the first processor (22) is allowed.

4) 1_REQ: High, 2_REQ: High

Because the EN terminal of each buffer (21, 31) is in a state of being inputted with low, the 1_BREQ signal and the 2_BREQ signal become high. Because the 1_BREQ signal is inputted to the first OR gate (OR_1), the first GNT terminal (GNT_1) of the first processor (22) may be inputted with high. Furthermore, the signal may be reversed via the third inverter (INV_3) to allow the second EN terminal (EN_2) to be inputted with low.

Furthermore, the 2_BREQ signal may be inputted to the first EN terminal (EN_1) via the first inverter (INV_1), that is, the first EN terminal (EN_1) may be inputted with low, and the 2_BREQ signal may be inputted to the GNT signal terminal (GNT_2) of the second processor (32). (i.e., the GNT_2 is inputted with high)

The logic state of the signal inputted to each terminal may be expressed as per the following Table 6.

TABLE 6

| 1_REQ | H | 2_REQ | H |
|---|---|---|---|
| GNT_1 | H | GNT_2 | H |
| EN_1 | L | EN_2 | L |

To summarize, because there is no access request to the memory (10) of two processors (22, 32) (1_REQ=H, 2_REQ=H), access request to the memory (10) of each processor (22, 32) is not granted or allowed (GNT_1=H, GNT_2=H).

Figure 2:
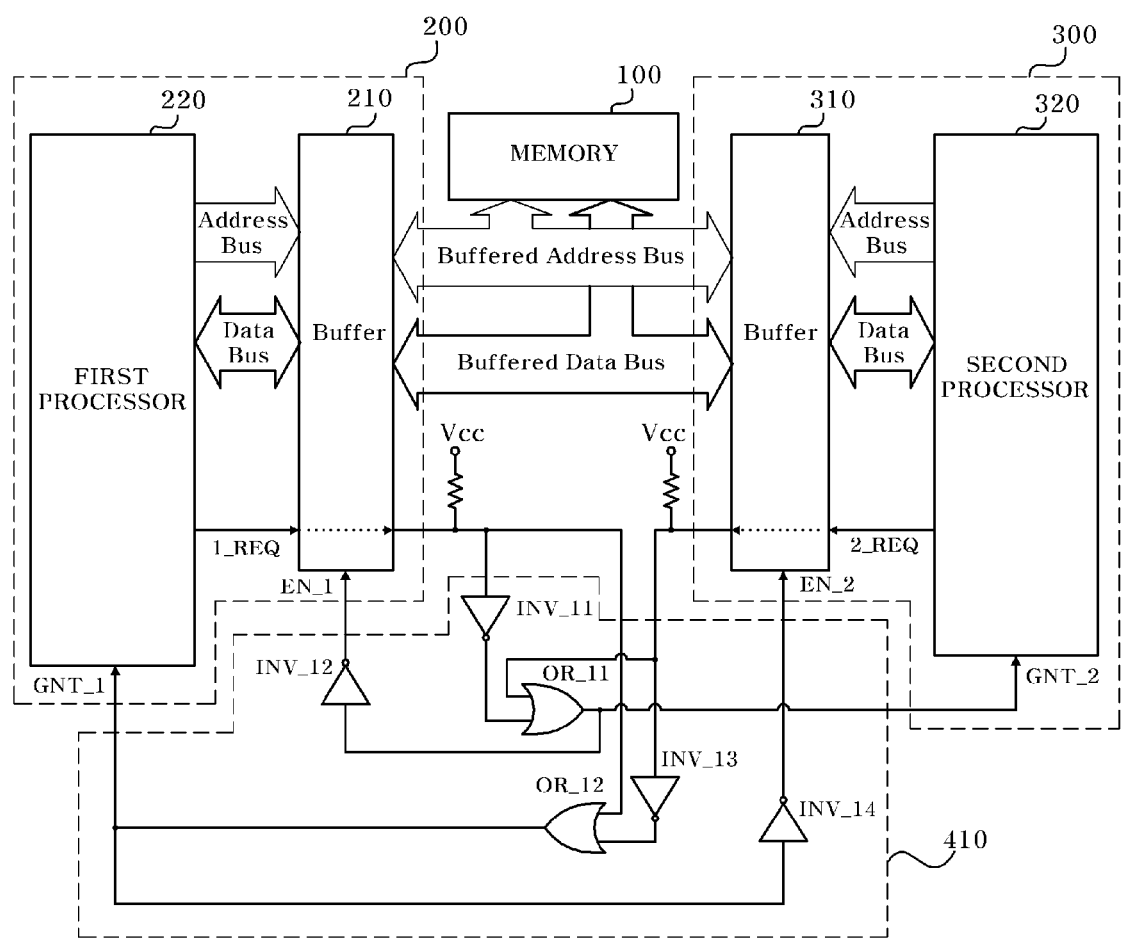
FIG. 2 is a schematic circuit diagram illustrating a connected configuration of a memory sharing circuit according to another exemplary embodiment of the present disclosure.

FIG. 2 is a schematic circuit diagram illustrating a connected configuration of a memory sharing circuit according to another exemplary embodiment of the present disclosure.

Referring to FIG. 2, a memory sharing circuit (100) exemplifies a circuit not granting or allowing a memory (10) access to any one, in a case both first and second processors (220, 320) request the memory (10) access (1_REQ & 2_REQ=L) in order to prevent a bus collision for access.

To be more specific, a connected relationship between processors (200, 300) of FIG. 1 and a logic circuit unit (410) will be described.

The memory sharing circuit of FIG. 2 is basically designed to operate in active low. Furthermore, each buffer (210, 310) is also active low.

A REQ signal buffered by a first buffer (210) may be connected to as a first input of an OR gate (OR_12), and the REQ signal may be connected to as a second input of an OR gate (OR_11) via an inverter (INV_11).

Furthermore, a REQ signal buffered by the second buffer (310) may be connected to as a second input of the OR gate (OR_12) via an inverter (INV_13), and may be connected to as a first input of the OR gate (OR_11).

An output of the OR gate (OR_11) may be applied to an EN terminal (EN_1) of the first buffer (210) via an inverter (INV_12), and may be inputted to a GNT terminal (GNT_2) of the second processor (320).

An output of the OR gate (OR_12) may be inputted to the GNT terminal (GNT_1) of the first processor (210), and inputted to an EN terminal of the second buffer (310) via an inverter (INV_14).

Furthermore, an output terminal of buffered REQ signal of each buffer (210, 310) is connected to a pull-up resistor, and in a case a high signal is inputted to EN terminals (EN_1, EN_2) of each buffer (210, 310), a signal outputted from the buffers (210, 310) may be floated, whereby a signal outputted from the buffers (210, 310) to a logic circuit unit (410) is maintained high in default in order to prevent the logic circuit unit (410) from changing in logic state.

Now, an operation of the memory sharing circuit illustrated in FIG. 2 will be described. As mentioned in the foregoing, the memory sharing circuit illustrated in FIG. 2 is set at an active low, such that an EN terminal must be inputted low in order for each buffer (210, 310) to buffer and output an inputted signal. That is, the EN terminal of the buffers (210, 310) is a terminal for receiving a signal for enabling an output of the buffer (210, 310).

Because each of 1_REQ signal and 2_REQ signal may have a high value or a low value, a total four (4) number of cases may be generated. However, the logic state of 1_REQ signal and 2_REQ signal, and GNT_1, GNT_2, EN_1 and EN_2 signals in response to operation of the memory sharing circuit illustrated in FIG. 2 are partially same as that of FIG. 1.

To be more specific, in a case (1_REQ, 2_REQ) are (L, H), (H, L) and (H, H), It is same as the operation of the logic circuit unit (40) of FIG. 1. Of course, it means that although the logic state of each signal may be partially same, operation or configuration of circuit is not same.

Hence, operation of the memory sharing circuit will be described only in a case when (1_REQ, 2_REQ) is (L, L).

Because a 2_REQ signal is low, and a 2_BREQ signal may be inputted to as a second input of the OR gate (OR_12) via an inverter (INV_13) to allow the GNT terminal (GNT_1) of the first processor (220) to be inputted high. Furthermore, the signal may be inputted to an EN terminal of the first buffer (310) via an inverter (INV_14).

Furthermore, a 1_BREQ signal is inputted to a second terminal of the OR gate (OR_11) via the inverter (INV_11) and a 2_BREQ signal is applied to a first terminal of the OR gate (OR_11), an output of the OR gate (OR_11) is applied to a GNT terminal (GNT_2) of the second processor (320), and also inputted to an EN terminal of the first buffer (210) via the inverter (INV_12). That is, the GNT_2 may be inputted high and the EN_1 may be inputted low, which may be arranged in the following Table 7.

TABLE 7

| 1_REQ | L | 2_REQ | L |
|-------|---|-------|---|
| GNT_1 | H | GNT_2 | H |
| EN_1  | L | EN_2  | L |

If the above is arranged, even if the first and second processors (220, 320) request an access to a sharing memory (100) (1_REQ=L, 2_REQ=L), all the access requests are designed not to be granted or allowed for preventing bus collision to memory (100) access (GNT_1=H, GNT_2=H).

Figure 3:
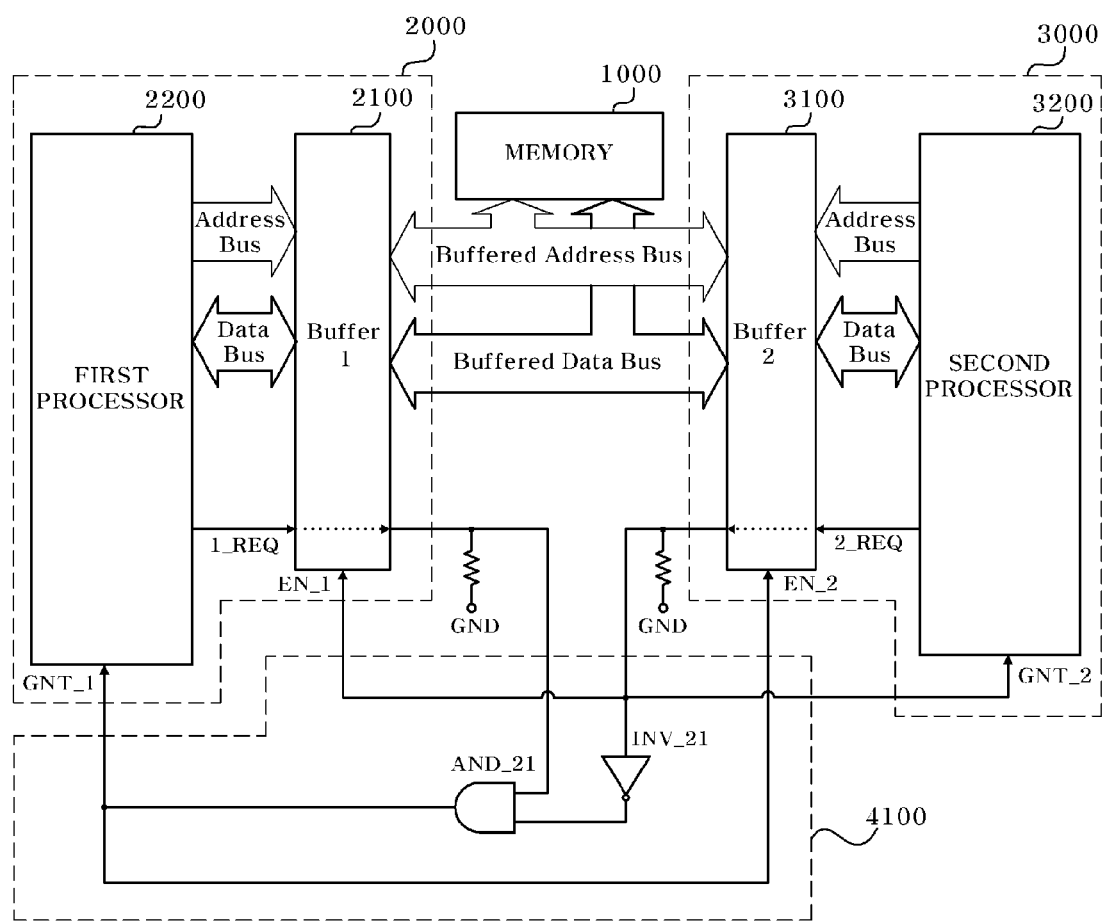
FIG. 3 is a schematic circuit diagram illustrating a connected configuration of a memory sharing circuit according to still another exemplary embodiment of the present disclosure.

FIG. 3 is a schematic circuit diagram illustrating a connected configuration of a memory sharing circuit according to still another exemplary embodiment of the present disclosure.

The memory sharing circuit illustrated in FIG. 3 exemplifies a case where the circuit is active high. That is, in a case each processor (2200, 3200) request a memory (1000) access, it may be designed that an REQ signal is applied high, and a GNT signal to an access grant or allowance is outputted high. Of course, in this case, each buffer (2100, 3100) operates active low.

Furthermore, the memory sharing circuit illustrated in FIG. 3 is configured such that a pull-down resistor is connected to a terminal of a signal outputted from each buffer (2100, 3100) to a logic circuit unit (4100), which is to prevent an output of each buffer from floating and to maintain the output low in default state.

Now, a connected configuration of a logic circuit unit (4000) of the memory sharing circuit illustrated in FIG. 3 will be described. A 1_BREQ signal may be connected to a first input of an AND gate (AND_21), a 2_BREQ signal may be connected to a second input of the AND gate (AND_21) via an inverter (INV_21). An output of the AND gate (AND_21) may be inputted to a GNT terminal (GNT_1) of the first processor (2200), and the output may be also inputted to an EN terminal (EN_2) of the second buffer (3100).

Furthermore, the 2_BREQ signal may be inputted to the EN terminal (EN_1) of the first buffer (2100), and may be also inputted to a GNT terminal of the second processor (3200).

Hence, a logic state of the memory sharing circuit in response to logic states of 1_REQ signal and 2_REQ signal may be expressed by the following Table 8.

TABLE 8

| 1_REQ | H | 2_REQ | H |
|-------|---|-------|---|
| GNT_1 | L | GNT_2 | H |
| EN_1  | H | EN_2  | L |
| 1_REQ | H | 2_REQ | L |
| GNT_1 | H | GNT_2 | L |
| EN_1  | L | EN_2  | H |
| 1_REQ | L | 2_REQ | H |
| GNT_1 | L | GNT_2 | H |
| EN_1  | H | EN_2  | L |
| 2_REQ | L | 1_REQ | L |
| GNT_1 | L | GNT_1 | L |
| EN_1  | L | EN_1  | L |

In a case 1_REQ and 2_REQ are (high, low) and (low, high), a memory (1000) access may be requested to only one of the processors 2200 and 3200, and the memory (1000) access may be requested to a relevant processor (2200 or 3200), and a GNT signal of the buffer (2100 or 3100), and EN signals may respectively become high and low to cause the memory (1000) access request to be granted or allowed (active high).

Furthermore, in a case 1_REQ and 2_REQ are high and high, which means that both processors (2200, 3200) request the memory access request, and in a case priority is provided to one of the processors (2200, 3200) by pre-design, for example, in a case the priority is given to the second processor (3200), the GNT signal of the buffer (3100) connected to the second processor (3200) and the EN signal may be respectively high and low to cause the memory (1000) access request to the second processor (3200) to be granted or allowed.

Meanwhile, in a case 1_REQ and 2_REQ are low and low, where all the processors (2200, 3200) do not request the memory (1000) access, all the processors (2200, 3200) and the GNT signal of buffers (2100, 3100) connected thereto and the EN signal may respectively become low and low to cause the memory (1000) access request not to be granted or allowed.

FIG. 4 is a flowchart illustrating an operation procedure of a memory sharing circuit according to an exemplary embodiment of the present disclosure.

The operation is an operation performable by each processor illustrated in FIGS. 1, 2 and 3, where a subject may be the processor.

The operation of the memory sharing circuit may include activating an REQ signal (S410), waiting for a GNT signal (S420), determining whether the GNT signal is activated (S430), accessing to a memory (S440), and deactivating the REQ signal (S450).

The step of S410 corresponds to an operation of activating the REQ signal (1_REQ or 2_REQ) outputted by each processor. According to a design environment of each memory sharing circuit, that is, according to active low or active high, the REQ signal may be activated (low or high).

The step of S420 corresponds to a step waiting for an input of a GNT signal in response to the activation of the REQ signal. The GNT signal is a signal granting or allowing an access to the memory, and may be used as a means notifying memory access grant or memory access allowance to each processor in response to the activation signal (active low or active high).

The step of S430 corresponds to an operation determining whether the GNT signal is an activation signal. If the GNT signal is an activation signal, each processor that has verified that the GNT signal is an activation signal attempts to an access to the memory (S440), and if the GNT signal is not an activation signal, the flow may return to the step (S420) waiting for the GNT signal.

Each processor, after completion of memory access, may perform the step of S450 deactivating the REQ signal. The exemplary embodiments of the present disclosure is to grant or allow the access of a plurality of processors to one memory without collision, where if the granted or allowed memory access is completed, the REQ signal must be deactivated to prepare for grant or allowance of access to other memories.

The memory sharing circuit and operation thereto have been exemplified and explained with reference to the accompanied drawings and description thereto. A plurality of processors is made to share a memory without mutual collision through the abovementioned circuit configuration and operation. Furthermore, a general memory with capacity of massive memory data is used to overcome the lack of storage space that used to happen in the general memory.

Although the present disclosure has been described with reference to a number of illustrative embodiments thereof, it should be understood that numerous other modifications and embodiments can be devised by those skilled in the art that will fall within the spirit and scope of the principles of this disclosure.

What is claimed is:

1. A memory sharing circuit comprising a plurality of unit processors connected to a memory, wherein each unit processor of the plurality of unit processors includes:
   a buffer configured to be connected to the memory via a buffering address bus and a buffering data bus; and
   a processor configured to be connected to the buffer for access to the memory through the buffer;
   wherein the plurality of unit processors are configured to allow all other processors of the plurality of unit processors to share the memory by preventing address or data bus collision; and
   wherein the memory sharing circuit further comprises a logic circuit unit configured to determine a logic value of a grant signal (GNT) of each processor of the plurality of unit processors and a logic value of an enable signal (EN) of each buffer of the plurality of unit processors using a signal buffered and output by the buffer.

2. The memory sharing circuit of claim 1, wherein the processor is configured to output an access request (REQ) to the memory to the buffer.

3. The memory sharing circuit of claim 2, wherein the buffer is configured to receive the access request (REQ) from the processor and to buffer and output the access request (REQ).

4. The memory sharing circuit of claim 1, wherein the grant signal (GNT) is a signal for allowing an access to the memory of the processor, and the enable signal (EN) is a signal for activating an output of the buffer.

5. The memory sharing circuit of claim 1, wherein the logic circuit unit is configured to allow only a processor of one unit processor among the plurality of unit processors to access the memory by determining a logic value of the grant signal (GNT) of the memory and a logic value of the enable signal (EN) of the buffer.

6. The memory sharing circuit of claim 5, wherein the logic circuit unit is configured such that:
   an REQ1 signal buffered by a first buffer inside a first unit processor of the plurality of unit processors is connected to a first input terminal of an OR gate,
   an REQ2 signal buffered by a second buffer inside a second unit processor of the plurality of unit processors is connected to:
      a second input terminal of the OR gate through a second inverter (INV_2),
      an enable signal terminal (EN_1) of the first buffer through a first inverter (INV_1), and
      a grant signal terminal (GNT_2) of a second processor inside the second unit processor, and
   an output of the OR gate is connected to:
      a grant signal terminal (GNT_1) of the first processor inside the first unit processor, and
      an enable signal terminal (EN_2) of the second buffer through a third inverter (INV_3).

7. The memory sharing circuit of claim 6, wherein a high signal is inputted to the GNT_1 terminal and a low signal is inputted to the GNT_2 terminal in a case the REQ1 signal is high and the REQ2 signal is low, or in a case the REQ1 signal is low and the REQ2 signal is low, to make a memory access request to be allowed only to the second processor inside the second unit processor.

8. The memory sharing circuit of claim 7, wherein a low signal is inputted to the GNT_1 terminal and a high signal is inputted to the GNT_2 terminal in a case the REQ1 signal is low and the REQ2 signal is high, to make a memory access request to be allowed only to the first processor inside the first unit processor.

9. The memory sharing circuit of claim 8, wherein a high signal is inputted to the GNT_1 terminal and the GNT_2 terminal in a case the REQ1 signal and the REQ2 signal are both high, to prevent a memory access request from being allowed to both the first processor of the first unit processor and the second processor of the second unit processor.

10. The memory sharing circuit of claim 5, wherein the logic circuit unit is further configured such that:
    the REQ1 signal buffered by a first buffer inside a first unit processor of the plurality of unit processors is connected to:
       a first input terminal of a first OR gate through a first inverter, and
       a first input terminal of a second OR gate,
    the REQ2 signal buffered by a second buffer inside a second unit processor of the plurality of unit processors is connected to:
       a second input terminal of a second OR gate through a third inverter, and
       a second input terminal of the first OR gate, an output of the first OR gate is connected to:
  a grant signal terminal (GNT__2) of a second processor inside the second unit processor, and
  an enable signal terminal (EN__1) of the first buffer through a second inverter, and
an output of the second OR gate is connected to:
  an enable terminal (EN__2) of the second buffer through a fourth inverter, and
  a grant signal terminal (GNT__1) of a first processor inside the first unit processor.

11. The memory sharing circuit of claim 10, wherein a high signal is inputted to the GNT__1 terminal and a low signal is inputted to the GNT__2 terminal in a case the REQ1 signal is high and the REQ2 signal is low, or in a case the REQ1 signal is high and the REQ2 signal is high, to make a memory access request allowed only to the second processor inside the second unit processor.

12. The memory sharing circuit of claim 11, wherein a low signal is inputted to the GNT__1 terminal and a high signal is inputted to the GNT__2 terminal in a case the REQ1 signal is low and the REQ2 signal is high to make a memory access request allowed only to the first processor inside the first unit processor.

13. The memory sharing circuit of claim 12, wherein a high signal is inputted to the GNT__1 terminal and the GNT__2 terminal in a case the REQ1 signal and the REQ2 signal are all low to prevent a memory access request from being allowed to both the first processor inside the first unit processor and the second processor inside the second unit processor.

14. The memory sharing circuit of claim 5, wherein the logic circuit unit is further configured such that:
  an REQ1 signal buffered by a first buffer inside a first unit processor of the plurality of unit processors is connected to a first input terminal of an AND gate,
  an output of the AND gate is connected to:
    a grant signal terminal (GNT__1) of a first processor inside the first unit processor, and
    an enable signal terminal (EN__2) of the second buffer, and
  an REQ2 signal buffered by a second buffer inside a second unit processor of the plurality of unit processors is connected to:
    a second input terminal of the AND gate through an inverter,
    an enable signal terminal (EN__1) of the first buffer, and
    a grant signal terminal (GNT__2) of a second processor inside the second unit processor.

15. The memory sharing circuit of claim 14, wherein a high signal is inputted to the GNT__1 terminal and a low signal is inputted to the GNT__2 terminal in a case the REQ1 signal is high and the REQ2 signal is low, to make a memory access request allowed only to the first processor inside the first unit processor.

16. The memory sharing circuit of claim 15, wherein a low signal is inputted to the GNT__1 terminal and a high signal is inputted to the GNT__2 terminal in a case the REQ1 signal is low and the REQ2 signal is high, to make a memory access request allowed only to the second processor of the second unit processor.

17. The memory sharing circuit of claim 16, wherein a low signal is inputted to the GNT__1 terminal and a high signal is inputted to the GNT__2 terminal in a case the REQ1 signal is high and the REQ2 signal is high, to make a memory access request allowed only to one processor provided with priority among the first processor inside the first unit processor or the second processor of the second unit processor.

18. The memory sharing circuit of claim 17, wherein a low signal is inputted to both the GNT__1 terminal and the GNT__2 terminal in a case both the REQ1 signal and the REQ2 signal are low to make a memory access request allowed to both the first processor inside the first unit processor and the second processor inside the second unit processor.

19. The memory sharing circuit of claim 18, wherein
  the buffer is configured to receive the access request (REQ) from the processor and to buffer and output the access request (REQ); and
  a pull-up resistor or a pull-down resistor is connected to an REQ output terminal of the buffer.

* * * * *